(12) United States Patent
Wang et al.

(10) Patent No.: US 10,008,387 B1
(45) Date of Patent: Jun. 26, 2018

(54) EMBEDDED MEMORY IN BACK-END-OF-LINE LOW-K DIELECTRIC

(71) Applicant: GLOBALFOUNDRIES Singapore Pte. Ltd., Singapore (SG)

(72) Inventors: Lei Wang, Singapore (SG); Chim Seng Seet, Singapore (SG); Kai Hung Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/432,941

(22) Filed: Feb. 15, 2017

(51) Int. Cl.
*H01L 21/762* (2006.01)
*H01L 21/3105* (2006.01)
*H01L 21/768* (2006.01)
*H01L 43/12* (2006.01)
*H01L 43/08* (2006.01)

(52) U.S. Cl.
CPC .. *H01L 21/31053* (2013.01); *H01L 21/76819* (2013.01); *H01L 21/76826* (2013.01); *H01L 43/08* (2013.01); *H01L 43/12* (2013.01)

(58) Field of Classification Search
CPC ............. H01L 21/762; H01L 21/76819; H01L 21/7685; H01L 21/31051
See application file for complete search history.

(56) References Cited

U.S. PATENT DOCUMENTS

| | | | |
|---|---|---|---|
| 6,261,914 B1 * | 7/2001 | Divakaruni | H01L 21/31053 257/E21.244 |
| 9,461,245 B1 * | 10/2016 | Yang | H01L 45/1253 |
| 9,577,009 B1 * | 2/2017 | Shih | H01L 45/1233 |
| 2017/0179378 A1 * | 6/2017 | Kar | H01L 43/08 |

* cited by examiner

*Primary Examiner* — Jae Lee
(74) *Attorney, Agent, or Firm* — Horizon IP Pte Ltd.

(57) ABSTRACT

A low-k dielectric layer, such as SiCOH, with high and stable chemical mechanical polishing (CMP) removal rate (RR) is disclosed. The polishing rate enhancer (PRE) is disposed on the low-k dielectric layer. The PRE increases the CMP RR during CMP. Furthermore, the PRE stabilizes the increases CMP RR. This is particularly useful, for example, for memory applications in which the storage unit is formed in a low-k back-end-of-line (BEOL) dielectric layer. For example, the topography created can be quickly planarized by CMP while producing a uniform polished surface of the low-k dielectric layer due to the shortened processing time.

20 Claims, 11 Drawing Sheets

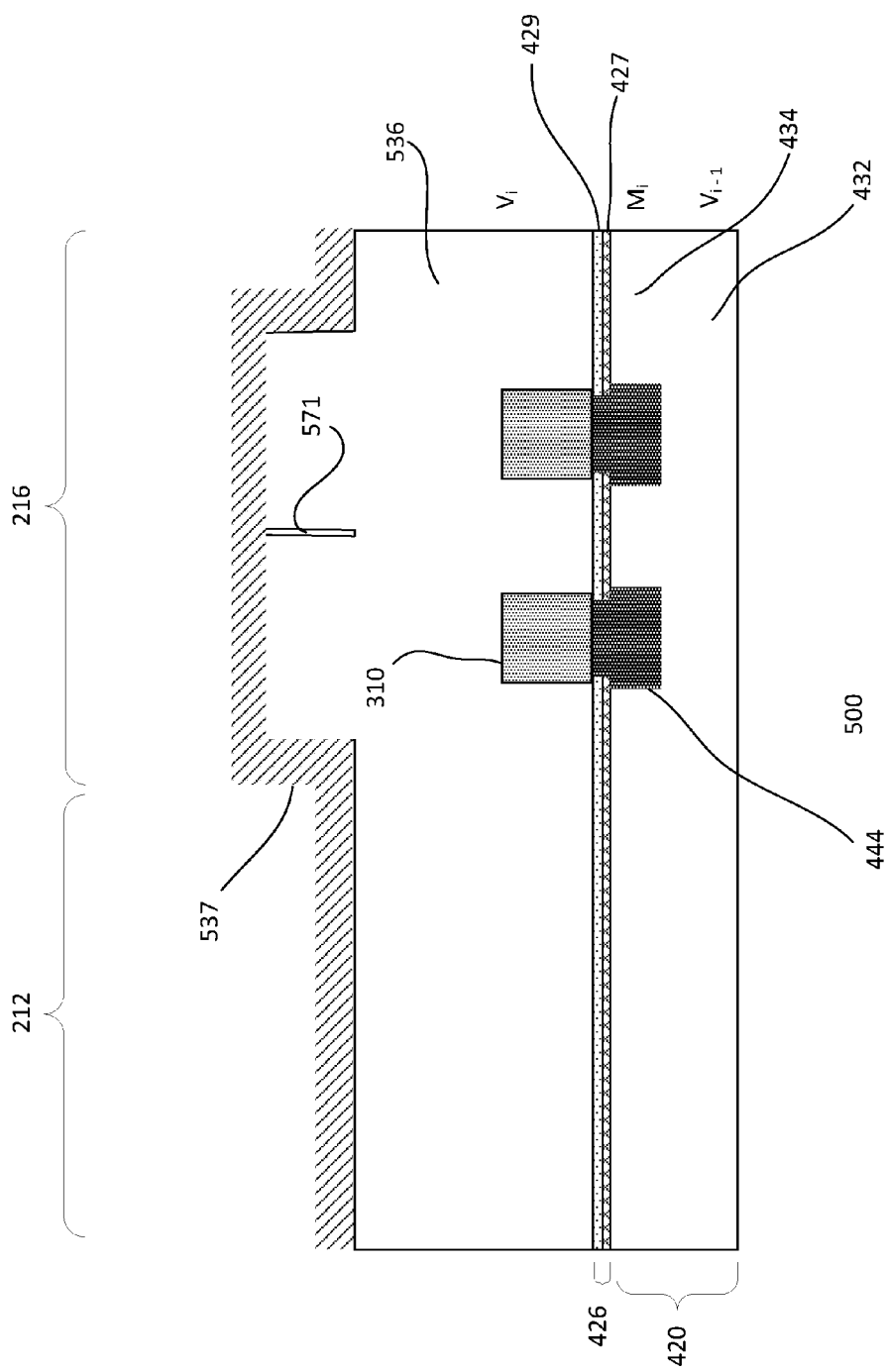

EMBEDDED MEMORY IN BACK-END-OF-LINE LOW-K DIELECTRIC

BACKGROUND

As demands in the semiconductor industry call for further miniaturization and performance enhancement of electronic systems, billions of transistors are now interconnected with tens of kilometers of wires that packed into an area of square centimeters. The complexity of the multi metallization levels of back-end-of-line (BEOL) brings challenges such as the need to decrease the resistive-capacitive (RC) delay, dynamic power consumption, cross-talk noise and reliability issues. Low-k dielectrics, such as carbon-doped silicon oxide (SiCOH), have been proposed as BEOL dielectrics. This includes applications which embed non-volatile memories (NVMs), such as magnetoresistive memories, in low-k BEOL dielectrics.

However, current processes for chemical mechanical planarization (CMP) of low-k dielectrics have challenges. For example, current low-k applications have low and unstable CMP removal rates (CMP RR). This is particularly problematic with embedded memory applications. For example, large amounts of low-k dielectrics need to be removed due to the resulting step height or surface topography of such applications. This results in long processing times. Furthermore, the long processing time with unstable removal rates results in surface non-uniformity, negatively impacting reliability.

The present disclosure relates to low-k dielectric applications which results in higher and more uniform CMP RR.

SUMMARY

Embodiments of the present disclosure generally relate to a device using low-k material as back-end-of-line (BEOL) dielectric and methods of forming the device.

In one embodiment, a method of forming the device is disclosed. The method includes providing a substrate circuit component formed on a substrate surface and performing BEOL processing to form a BEOL dielectric layer comprising a plurality of interlevel dielectric (ILD) levels over the substrate. The method also includes forming a storage unit of a memory cell between two adjacent metal levels of the BEOL dielectric layer. Formation of the storage unit includes forming a low-k cell dielectric layer over the storage unit, a polishing rate enhancer (PRE) layer over the low-k cell dielectric layer and performing chemical mechanical polishing (CMP) on the substrate to remove PRE and excess low-k cell dielectric layer. The PRE layer functions to change the characteristics of the low-k cell dielectric layer during CMP which results in the low-k cell dielectric layer having an increased and stable CMP removal rate (RR).

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 5a-5g show simplified cross-sectional views of an embodiment of a process for forming a device.

DETAILED DESCRIPTION

Embodiments generally relate to devices, for example, semiconductor devices or integrated circuits (ICs). More particularly, embodiments relate to forming embedded memory in BEOL dielectric of an IC. The ICs can be any type of ICs with embedded memory, such as signal processors, microcontrollers or system-on-chip (SoC) ICs. Other types of ICs or devices may also be useful. The devices or ICs can be incorporated into or used with, for example, consumer electronic products, or other types of products.

The fabrication of devices may involve the formation of features on a substrate that make up circuit components, such as transistors, resistors and capacitors. The devices are interconnected, enabling the ICs to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1:
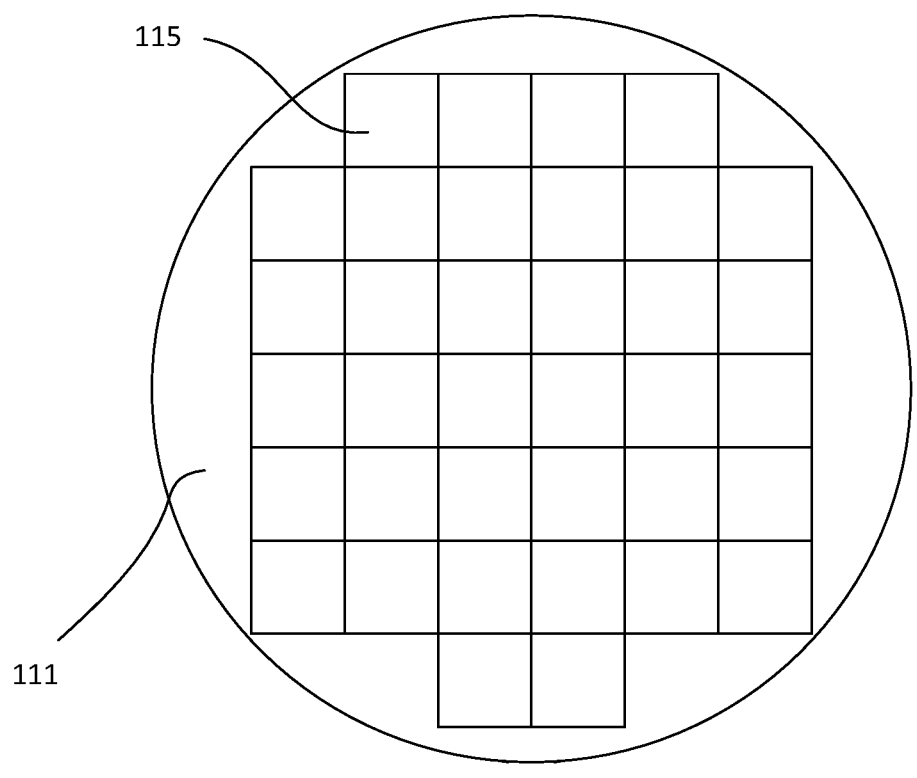
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer as well as doped wafers with other types of dopants or dopant concentrations may also be useful.

The wafer includes an active surface 111 on which devices 115 are formed. A plurality of devices may be formed on the wafer in parallel. The devices, for example, are arranged in rows along a first (x) direction and columns along a second (y) direction. Wafer dicing process is then performed. When the process is completed, the wafer is diced along the dicing channels to singulate the devices into individual chips.

Figure 2:
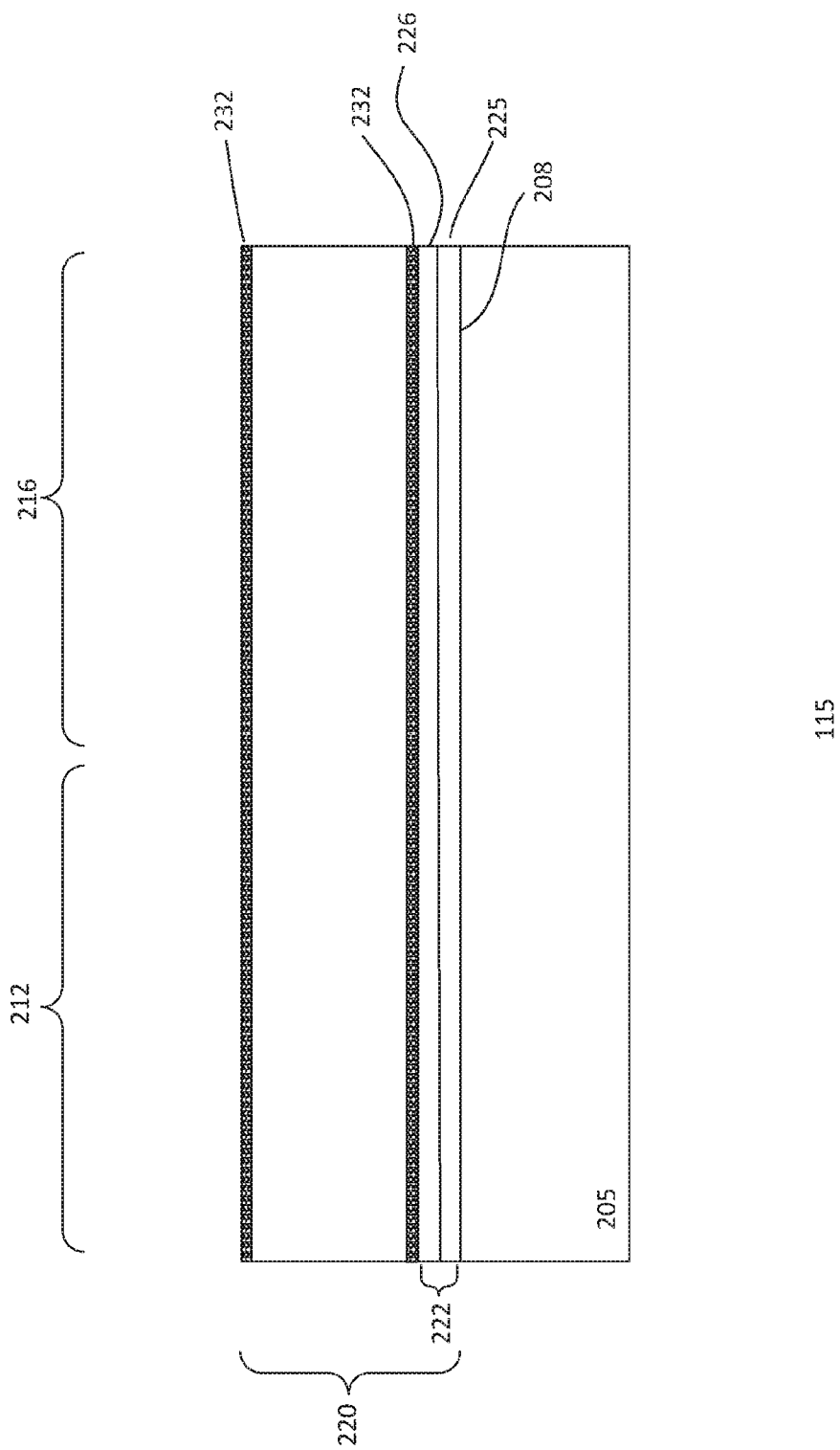
FIG. 2 shows a simplified cross-sectional view of an embodiment of a device.

FIG. 2 shows a simplified embodiment of a device 115. The device, for example, is an integrated circuit (IC). Other types of devices may also be useful. The device, for example, may be formed in parallel on a wafer and subsequently be singulated. The device includes a substrate 205. The device, for example, may be a part of the wafer, as described in FIG. 1. Common elements may not be described or described in detail. The substrate, for example, may be a semiconductor substrate, such as a silicon substrate. Other types of substrates or wafers may also be useful.

The substrate of the device, as shown, includes first and second device region 212 and 216. In one embodiment, the first region is a non-memory region and the second region is a memory region. The memory region, for example, includes embedded memory. For example, the memory region includes an array of memory cells. A memory cell may include a cell select unit and a storage unit. In one embodiment, the storage units of the memory cells are disposed in BEOL dielectric 220 while select units, such as transistors, may be disposed on the substrate. As for the non-memory region, it may include numerous sub-regions. For example, the various sub-regions may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors. Other types of components or device regions may also be useful.

Front-end-of-line (FEOL) processing is performed on the substrate. For example, isolation regions are formed to isolate different device regions. The isolation regions, for example, are shallow trench isolation (STI) regions. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, gate oxide layer, such as thermal silicon oxide, followed by a gate electrode layer, such as polysilicon. The gate electrode may be doped. Other types of gate materials may also be useful. Separate processes may be performed for forming gate dielectrics of the different voltage transistors. This is due to, for example, different gate oxide thicknesses associated with the different voltage transistors. For example, a HV transistor will have a thicker gate dielectric than a LV transistor.

The gate layers, in one embodiment, may be formed on the active surface of the substrate 208. After the gate layers are formed on the active surface of the substrate 208, they are patterned to form gates. For example, a photoresist mask may be used for a reactive ion etch (RIE) to pattern the gate layers to form the gates. Source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist mask.

After forming transistors, back-end-of-line (BEOL) processing is performed. The BEOL process includes forming interconnects in ILD layers of a BEOL dielectric layer 220. For example, the BEOL includes a plurality of (ILD) layers 222 in which interconnects are formed. The interconnects connect the various components of the IC to perform the desired functions. An ILD layer includes a metal level 226 and a contact level 225 below. Generally, the metal level includes conductors or metal lines while the contact level includes contacts. The conductors and contacts may be formed of metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene techniques. This results in the conductors and contacts having the same material. In some cases, the conductors and contacts may have different materials. Forming the upper metal levels using single damascene techniques may also be useful. For example, in the case where the contacts and conductors are formed by single damascene techniques, the materials of the conductors and contacts may be different. Other techniques, such as reactive ion etch (RIE) may also be employed to form metal lines.

As discussed, a device may include a plurality of ILD layers or levels 222. For example, x number of ILD levels may be provided in the BEOL dielectric layer. For example, 5 ILD levels (x=5) may be provided for the device. Other numbers of ILD levels may also be useful. The number of ILD levels may depend on, for example, design requirements or the logic processes involved. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level, it may be referred to as CA.

The BEOL process, for example, commences by forming a dielectric layer 225 over the transistors and other components formed in the FEOL process. For example, the dielectric layer may be silicon oxide or low-k dielectric, such as carbon-doped silicon oxide (SiCOH), formed by chemical vapor deposition (CVD). The dielectric layer serves as a pre-metal dielectric layer or the first contact layer of the BEOL process. The dielectric layer may be referred to as the CA level of the BEOL process. Contacts are formed in the CA level dielectric layer. The contacts may be formed by single damascene techniques. Via openings are formed in the dielectric layer using mask and etch techniques. For example, a pattern resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical planarization (CMP), is performed to remove excess conductive materials, leaving contact plugs in the CA level.

After forming contacts in the CA level, the BEOL process continues to form a dielectric layer 226 over the substrate, covering the CA level dielectric layer. The dielectric layer, for example, serves as the first metal level $M_1$ of the first ILD layer. The dielectric layer, for example, is a silicon oxide or a low-k dielectric layer, such as SiCOH. Other types of dielectric layers may also be useful. The dielectric layer may be formed by CVD. Other techniques for forming the dielectric layer may also be useful.

Conductive lines are formed in the $M_1$ level dielectric layer. The $M_1$ conductive lines may be formed by single damascene techniques. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. The first metal level $M_1$ and CA may be referred as a lower ILD level 225.

The process continues to form additional ILD layers. For example, the process continues to form upper ILD levels (not shown). The upper ILD levels may include ILD level 2 to ILD level x. For example, in the case where x=5 (5 levels), the upper levels include ILD levels from 2 to 5, which includes $M_2$ to $M_5$. The number of ILD layers depends on, for example, design requirements or the logic process involved. These ILD layers may be referred to as intermediate ILD layers. The intermediate ILD layers may be formed of silicon oxide. For example, the ILD layers may be tetraethyl orthosilicate (TEOS) ILD layers. Other types of dielectric materials, such as low-k, high-k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structures may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductors and contacts in the intermediate ILD layer. In other embodiments, the upper ILD layers may be formed by single damascene techniques. For example, in single damascene techniques, separate etch and fill processes are employed for the vias and metal levels. Forming the upper ILD layers using a combination of single and dual damascene techniques may also be useful. For example, one or more upper levels may be formed by single damascene techniques while others are formed by dual damascene techniques.

A dielectric liner 232 may be disposed between ILD levels, on the substrate. In some embodiments, a dielectric liner (not shown) may be disposed between a metal and a via level. The dielectric liner, for example, serves as an etch stop layer. The thickness of the dielectric liners may be about 200 Å. Other thicknesses may also be useful. The dielectric liners may be formed of a low-k dielectric material. For example, the dielectric liners may be NBLoK. Other types of dielectric materials for the dielectric liners may also be useful. It is understood that different dielectric liners need not to be formed of the same material.

The uppermost ILD level (e.g., x) may have different design rules, such as critical dimension (CD), than the lower ILD levels. For example, the top metal level $M_x$ may have a larger CD than the lower metal levels $M_1$ to $M_{x-1}$. For example, the uppermost or top metal level may have a CD which may be greater than 6× compared to the lower levels. The lower levels may be 1×, 2× or 6×. Other configurations of the lower levels may also be useful.

In one embodiment, a pad level (not shown) may be provided over the uppermost ILD level. The pad level, for example, includes a pad metal level disposed over a pad via level. The pad metal level includes pad interconnects. The pad metal level may be an ultra-thick metal (UTM) level. For example, the pad interconnects are UTM pad interconnects. The UTM metal level may be much thicker than other metal levels. The pad interconnects and pad via contacts may be formed of copper or copper alloy. Other types of conductive materials and other processes may be employed to form the pad interconnects and via contacts.

A passivation layer (not shown) is disposed over the pad level. The passivation layer, for example serves to protect the device from cracking, oxidation, moisture as well as downstream processes. In some embodiments, the passivation layer may include a plurality of passivation layers. Other configurations of passivation layer may also be useful. Pad openings are provided to expose the pad interconnects. The pad interconnects provide external connections to the device.

Figure 3:
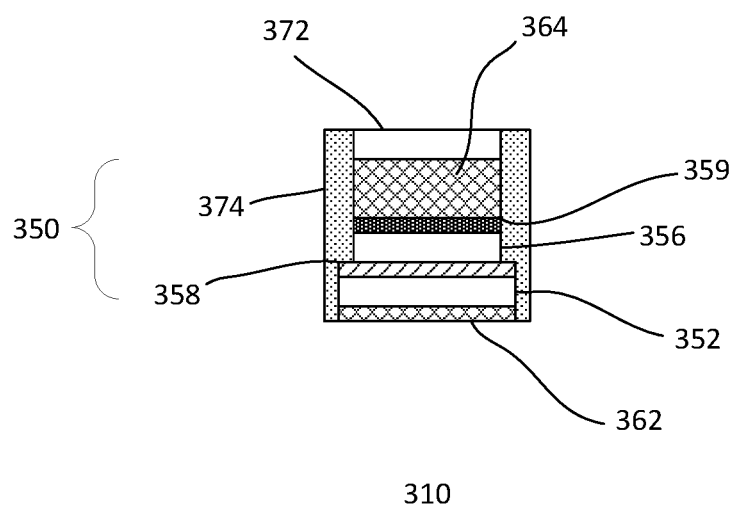
FIG. 3 shows an embodiment of a storage unit of a memory cell.

FIG. 3 shows an embodiment of a storage unit 310 of a memory cell. The storage unit, in one embodiment, is a magnetoresistive storage unit for a magnetoresistive random access memory (MRAM) cell. Other types of storage units may also be useful. As shown, the storage unit includes a magnetic tunnel junction (MTJ) module 350 disposed between bottom and top electrodes 362 and 364. The bottom electrode 362 is proximate to the substrate on which the memory cell is formed while the top electrode 364 is distal from the substrate.

The MTJ module includes first and second magnetic layers 352 and 356 separated by a tunneling barrier layer 358. One of the magnetic layers is a fixed magnetic layer while the other magnetic layer is a free magnetic layer. For example, the magnetization of the fixed magnetic layer is fixed in a first direction while the magnetization of the free magnetic layer may be programmed to be in the first or same direction as the fixed layer or in a second or opposite direction as the fixed layer.

For example, the magnetic orientation or magnetization of the free layer may be in the second or anti-parallel direction to the fixed layer. The corresponding MTJ electrical resistance between the free layer and the fixed layer may be denoted as $R_{AP}$. In the case that the magnetic orientation of the free layer is programmed to be in the first or parallel direction as the fixed layer, the corresponding MTJ electrical resistance between the free layer and the fixed layer may be denoted as $R_P$. The resistance $R_{AP}$ is higher than the resistance $R_P$.

In one embodiment, the first and second directions may be in the perpendicular direction, forming a perpendicular MTJ (pMTJ) module. The perpendicular direction, for example, is the direction perpendicular to the direction of the substrate surface. The first perpendicular direction may be downwards toward the substrate surface while the second opposite perpendicular direction may be upwards away from the substrate surface. In another embodiment, the first and second directions may be in the horizontal direction, forming a horizontal MTJ (hMTJ) module. The horizontal direction, for example, may be the direction parallel to the direction of the substrate surface. The first may be to the right while the second opposite direction may be to the left. Other configurations of horizontal and perpendicular directions may also be useful.

The MTJ module may be configured as a bottom pinned pMTJ or hMTJ module. In a bottom pinned MTJ module, the fixed magnetic layer is disposed below the free magnetic layer. Alternatively, the MTJ module may be configured as a top pinned pMTJ or hMTJ module. In a top pinned MTJ module, the fixed magnetic layer is disposed above the free magnetic layer.

As shown, the MTJ module includes a capping layer 359 is provided over the second magnetic layer. For example, the capping layer is disposed between the top electrode and second magnetic layer. The capping layer serves to protect the underlying magnetic layer. The capping layer 359 may be Platinum (Pt), Ruthenium (Ru), Tantalum (Ta) or other suitable metals. A dielectric hard mask layer 372 may be disposed over the top electrode. The hard mask, for example, may be silicon oxide. Other types of dielectric hard mask materials may also be useful.

A dielectric encapsulation 374 surrounds the storage unit. The dielectric encapsulation, for example, may be silicon nitride. Other types of dielectric encapsulations may also be useful. The silicon nitride encapsulation may be formed by, for example, CVD. The encapsulation may serve to protect the MTJ module.

The MTJ module, as described, is a simplified description. In actuality, the MTJ module may include other layers. For example, the MTJ module may include seed and/or wetting layers to form the magnetic layers. In addition, the magnetic layers may include multiple magnetic layers. For example, the free magnetic layer may be a mono-coupling stack or a multiple coupling stack having a plurality of mono-coupling stacks separated by coupling layers. A coupling stack includes a coupling layer between two magnetic layers. As for the fixed magnetic layer may include a pinning layer and a reference layer. The pinning layer serves as a hard magnet for fixing the magnetization of the reference layer.

As an example, the magnetic layers may be Cobalt-Iron-Boron (CoFeB) or Cobalt-Iron (CoFe) based composite materials, the tunneling barrier and coupling layers may be Magnesium Oxide (MgO) or Aluminum Oxide ($Al_2O_3$), the pinning layer may be Platinum-Manganese (PtMn), Iridium-Manganese (IrMn) or multilayers of Cobalt/Platinum (Co/Pt), Cobalt/Nickel (Co/Ni), the top and bottom electrodes may be Tantalum Nitride (TaN) or Tantalum (Ta). Other suitable materials for the MTJ module may also be useful. The MTJ stack may include other layers as well. Other suitable configurations of MTJ may also be useful. A description of MTJ elements may be found in, for example, *Materials Today Journal*, Volume 9, Issue 11, pages 36-45 (November 2006), which is herein incorporated by reference for all purposes.

As shown, the upper portion of the storage unit 310, which includes the second magnetic layer and layers above, is smaller than the lower portion of the storage unit, which includes the tunneling barrier layer and layers below. For example, the upper and lower portions are formed using separate anisotropic etch processes, such as reactive ion etch (RIE) processes. In one embodiments, the layers of the lower portion are formed and patterned using a hard mask. A sacrificial dielectric layer is formed on the substrate and is planarized to remove excess dielectric materials, forming a planar top surface between the sacrificial dielectric layer and lower storage unit portion. Subsequently, layers of the upper portion of the storage unit are formed and patterned using a hard mask. Subsequently, the sacrificial dielectric layer is removed, leaving the storage unit. A dielectric encapsulation is formed, surrounding the storage unit. Other techniques or processes may also be used to form the storage unit.

Figure 4:
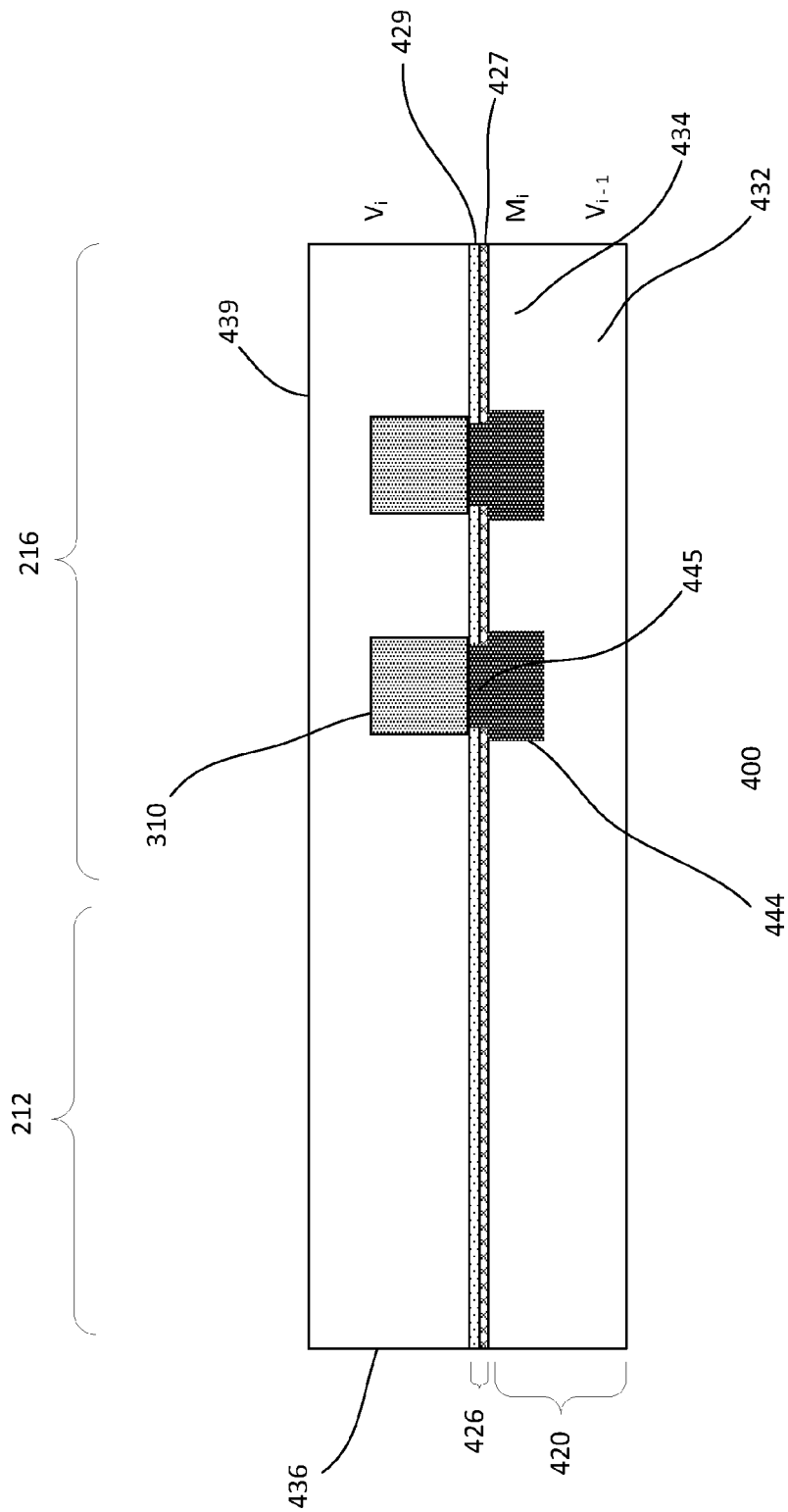
FIG. 4 shows a simplified embodiment of BEOL with magnetic memory stacks.

FIG. 4 shows a cross-sectional view of a simplified embodiment of a device 400. As shown, the device depicts an $i^{th}$ ILD level 420 of a device having x ILD levels. For example, the BEOL processing forms x ILD levels. An ILD level includes a via level 432 disposed below a metal level 434. For example, the $i^{th}$ ILD level includes $M_i$ disposed over $V_{i-1}$. The $i^{th}$ metal level $M_i$ includes metal lines 444 while the via level $V_{i-1}$ includes via contacts coupled to the M metal lines. The $i^{th}$ ILD level may be any ILD level of the BEOL dielectric, where i is from 1 to x-1. For example, the $i^{th}$ ILD level may be any metal level except the top ILD level (e.g., i<x). The $i^{th}$ ILD level, for example, may be x-1 ILD level. Other $i^{th}$ ILD levels, where i<x, may also be useful. In one embodiment, the ILD levels of the device are formed of a low-k dielectric. For example, the ILD levels may be formed of SiCOH. The low-k dielectric, for example, may have a k value of about 2.7. Other type of low-k dielectrics may also be useful.

It is understood that the device includes a substrate (not shown) prepared with components from FEOL processing, as described with respect to FIG. 2. Common elements may not be described or described in detail. The substrate, for example, may be a semiconductor substrate, such as a silicon substrate. Other types of substrates or wafers may also be useful.

The device, as shown, includes first and second device regions 212 and 216. In one embodiment, the first region is a non-memory region and the second region is a memory region. The memory region, for example, includes embedded memory. For example, the memory region includes an array of memory cells. A memory cell may include a cell select unit and a storage unit 310. In one embodiment, the storage unit of the memory cells is disposed in BEOL cell dielectric 436 while select unit, such as a transistor, may be disposed on the substrate. The select units may be formed on the substrate by FEOL processing. As for the non-memory region, it may include numerous sub-regions. For example, the various sub-regions may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors formed on the substrate by FEOL processing. Other types of components or device regions may also be useful.

A cap layer 427, in one embodiment, is disposed over $M_i$. The cap layer, for example, serves as an etch stop layer as well to protect $M_{i-1}$ layer. The cap layer is a dielectric layer. In one embodiment, the cap layer is a low-k dielectric layer. For example, the cap layer may be a SiCNH layer, such as NBLoK. A via dielectric layer 429 is disposed over the cap layer. The via dielectric layer, for example, is a silicon oxide layer. Other types of via dielectric layers may also be useful. The via dielectric layer and cap layer, for example, may be collectively referred to as a lower cell via layer or level 426. The thickness of the lower cell via level may be about 60 nm. Other thicknesses may also be useful.

In one embodiment, a cell dielectric layer 436 is disposed over the $i^{th}$ ILD level. For example, the cell dielectric layer is disposed over the lower cell via level. The cell dielectric layer, in one embodiment, is a low-k dielectric layer. For example, the cell dielectric layer is a SiCOH layer. Other types of low-k dielectric may also be useful. The cell dielectric layer may be referred to as an upper cell via level. The upper cell via level and lower cell via level collectively form the cell via level. The cell via level, for example, may be the via level of the i+1 ILD level. For example, the cell via level is $V_i$ level of the i+1 ILD level.

The cell dielectric includes storage units 310 disposed in the array region 216. The storage units, for example, are magnetoresistive storage units of MRAM cells. The storage units, for example, includes storage units such as those described in FIG. 3. The storage units are not described in detail. A storage unit, for example, includes a MTJ module disposed between bottom and top electrodes. Other types of storage units may also be useful. As shown, openings in the lower cell via dielectric level 426 include storage unit contacts 445 which are coupled to the storage units. For example, the storage unit contacts coupled the bottom electrodes of the storage units to the $M_i$ metal lines. The storage unit contacts, for example, may be metal storage unit contacts, such as copper or copper alloy. The storage unit contacts may be the same material as the metal lines. Other types of storage unit contacts may also be useful.

In one embodiment, the cell dielectric includes a planar top surface 439. The planar top surface, for example, is a polished top surface. The polished top surface, for example, may be a chemical mechanical polished (CMP) top surface. The cell dielectric layer, for example, may be about 2000 Å thick. Typically, the cell dielectric layer has about 500-1000 Å over the top of the storage units. Other thicknesses for the cell dielectric layer may also be useful. In one embodiment, a height of the storage unit is about 1500 Å and the thickness of the dielectric layer over the storage unit is about 500 Å, resulting in a cell dielectric layer having an overall thickness of about 2000 Å.

In one embodiment, the cell dielectric layer has no or reduced water absorption during CMP. The no or reduced water absorption by the cell dielectric layer during CMP results in an increased and stable CMP polishing or removal rate (RR). This reduces processing time as well as increased surface uniformity of the cell dielectric layer. As such reliability is improved.

A metal level (not shown) may be disposed over $V_i$. For example, $M_{i+1}$ may be disposed over $V_i$. Depending on i, additional ILD levels as well as UTM level and passivation layer may be provided over $M_{i+1}$. Over device layers may also be provided.

FIGS. 5a-5f show cross-sectional views of an embodiment of a process for forming a device 500. The process relates to forming a cell dielectric layer in the device. Referring to FIG. 3, a simplified portion of the device is shown. The device may be similar to that described in FIG. 4. Common elements may not be described or described in detail. The device, for example, includes a substrate (not shown) which includes FEOL components. The device includes first and second regions 212 and 216. In one embodiment, the first region is a non-memory region and the second region is a memory region.

An ILD level 420 is shown. The ILD level, for example, is the $i^{th}$ ILD level. The ILD level includes a via level 432 disposed below a metal level 434. Metal lines 444 are disposed in the metal level while via contacts (not shown) are disposed in the via level. For example, the $i^{th}$ ILD level includes metal level $M_i$ over via level $V_{i-1}$. The metal lines and via contacts may be copper or copper alloy and formed by dual damascene techniques. Other types of metal lines and via contacts or other forming techniques may also be useful. Depending on i, the device includes lower ILD levels (not shown). For example, the device may include 1 to i−1 ILD levels.

Figure 5A:
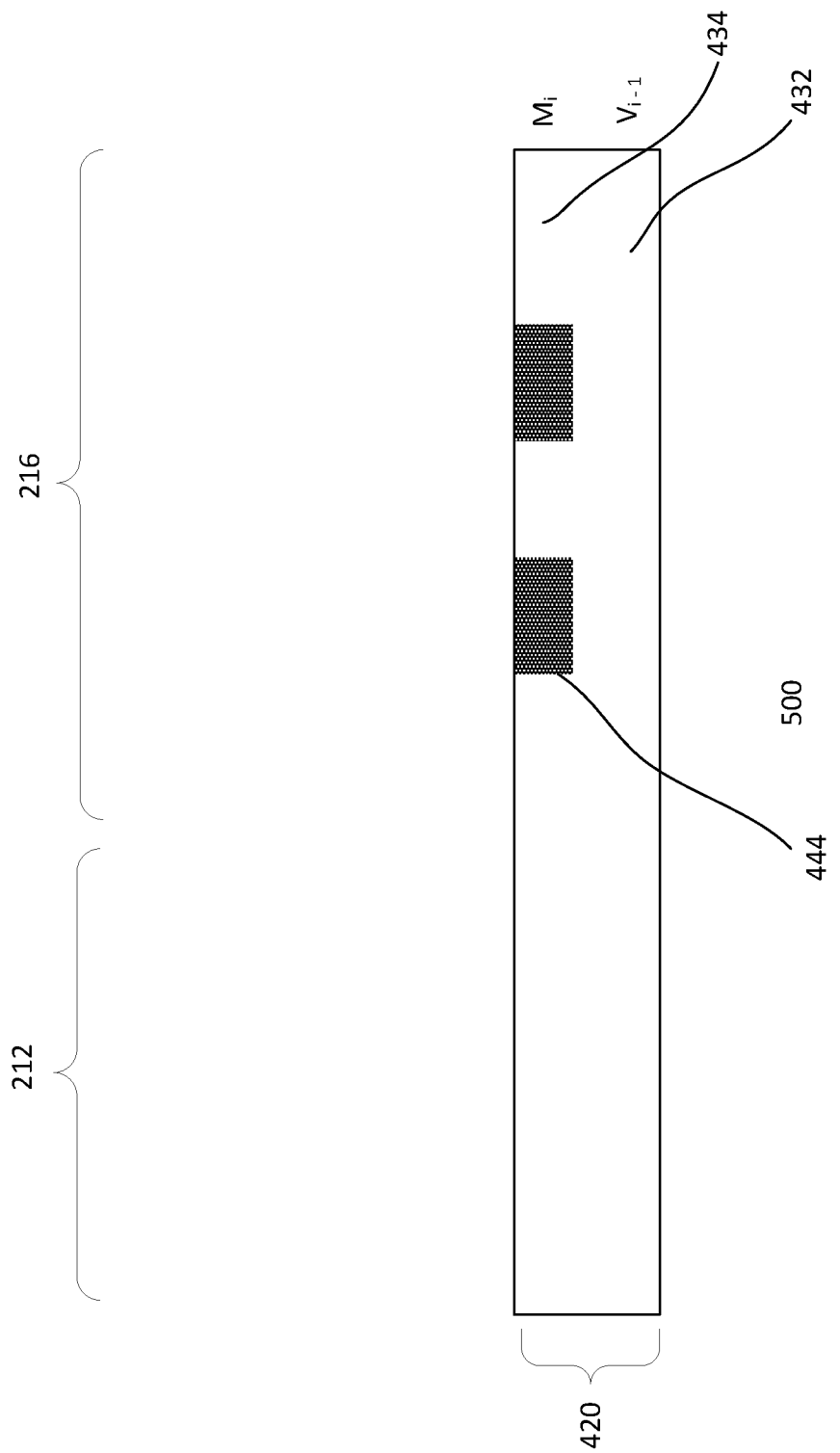
Figure 5B:
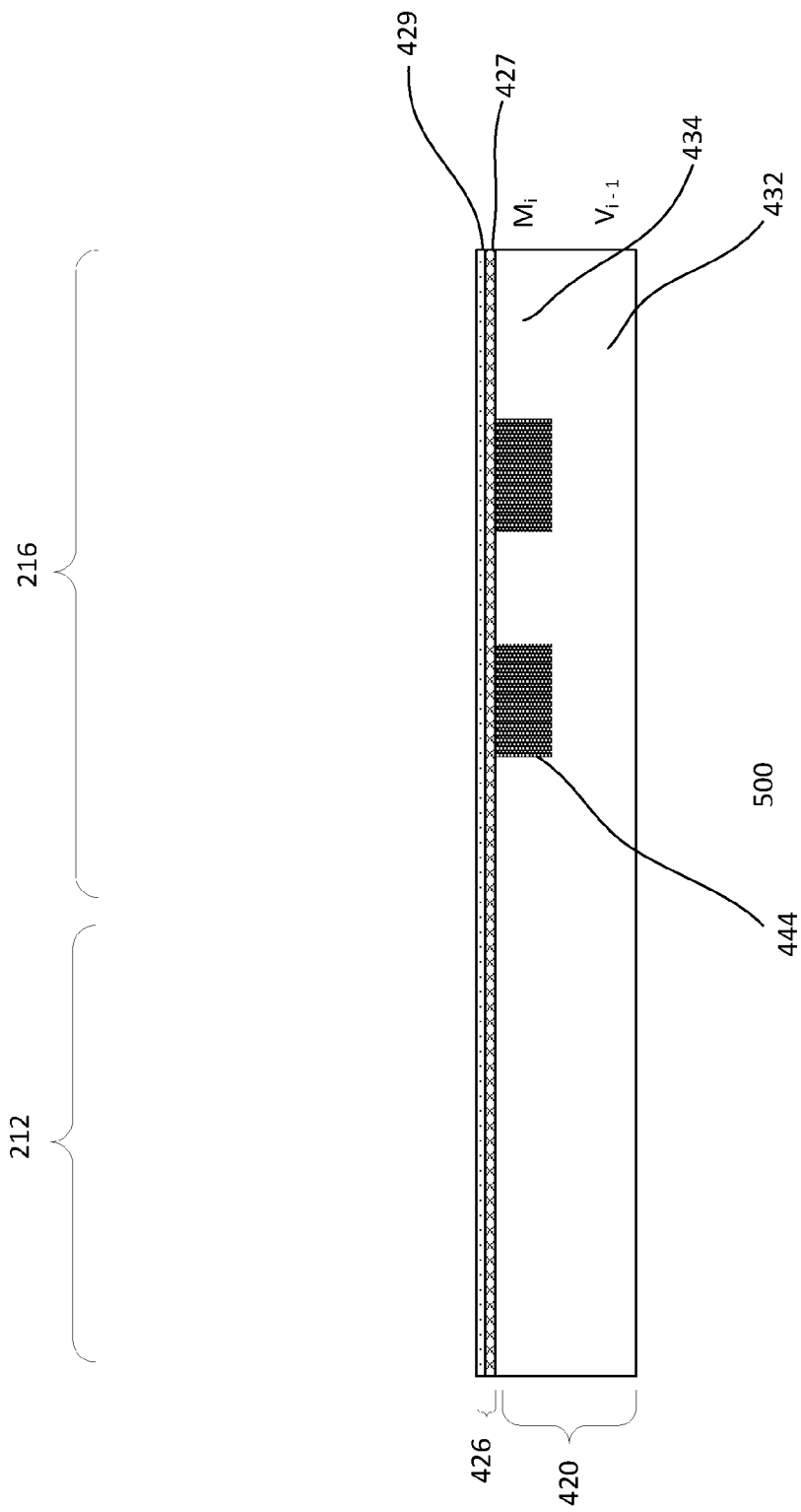

In FIG. 5b, a lower cell via dielectric layer 426 is formed over the $M_1$. In one embodiment, the lower cell via dielectric layer includes a cap layer 427 over $M_i$ and a via dielectric layer 429 thereover. The cap layer, for example, serves as an etch stop layer as well to protect $M_{i-1}$ layer. In one embodiment, the cap layer is a low-k dielectric layer. For example, the cap layer may be a SiCNH layer, such as NBLoK. As for the via dielectric layer, it may be a silicon oxide layer. Other types of via dielectric layers may also be useful. The thickness of the lower cell via dielectric layer may be about 60 nm. Other thicknesses may also be useful.

Figure 5C:
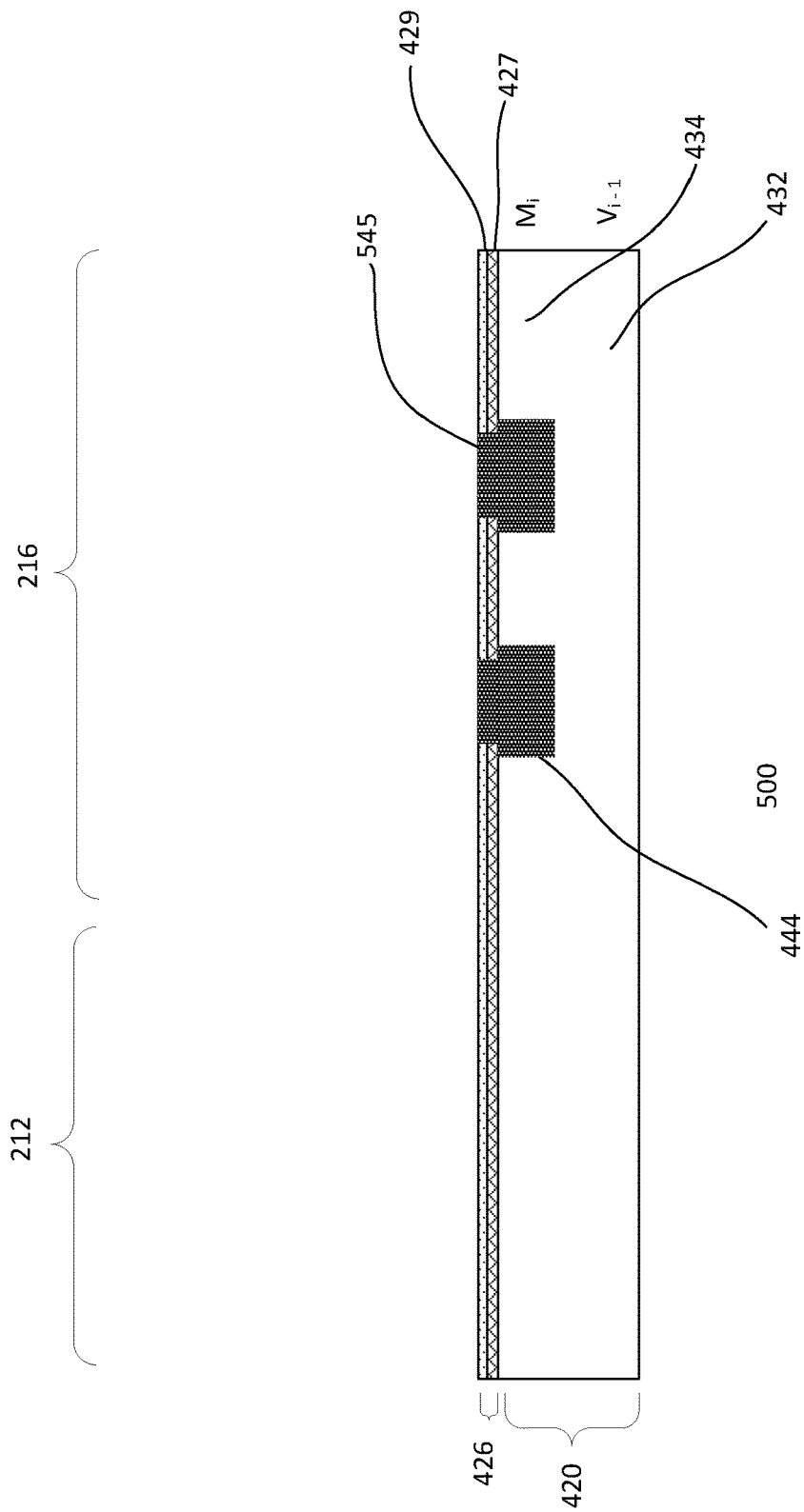

Referring to FIG. 5c, the lower cell via dielectric layer is patterned to form openings to expose the metal lines. Patterning the lower cell via dielectric layer may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to locations where the dielectric layer is removed to expose the $M_i$ metal lines. To improve lithographic resolution, an anti-reflective coating (ARC) may be used below the photoresist layer. The patterned mask layer is used to pattern the lower cell via dielectric layer. For example, an anisotropic etch, such as reactive ion etch (RIE), is used to remove exposed portions of the lower cell via dielectric layer. Other types of etch processes may also be useful. The etch transfers the pattern of the mask layer to the underlying lower cell via dielectric layer. For example, the pattern of the mask layer is transferred to the cell via dielectric layer and cap layers.

A conductive layer is formed on the substrate. For example, the conductive layer fills the openings as well as covering the dielectric layer. In one embodiment, the conductive layer is copper or a copper alloy. The conductive layer may be formed by plating, such as electro plating. Other types of conductive layer or forming techniques may also be useful.

The substrate is planarized. In one embodiment, the substrate is planarized to remove excess conductive materials, forming storage unit contacts 545. As shown, the storage unit contacts are coplanar with the dielectric layer. Planarizing the substrate, in one embodiment, includes polishing the substrate surface. For example, chemical mechanical polishing (CMP) is employed to planarize the substrate surface. Other planarizing techniques may also be useful.

Figure 5D:
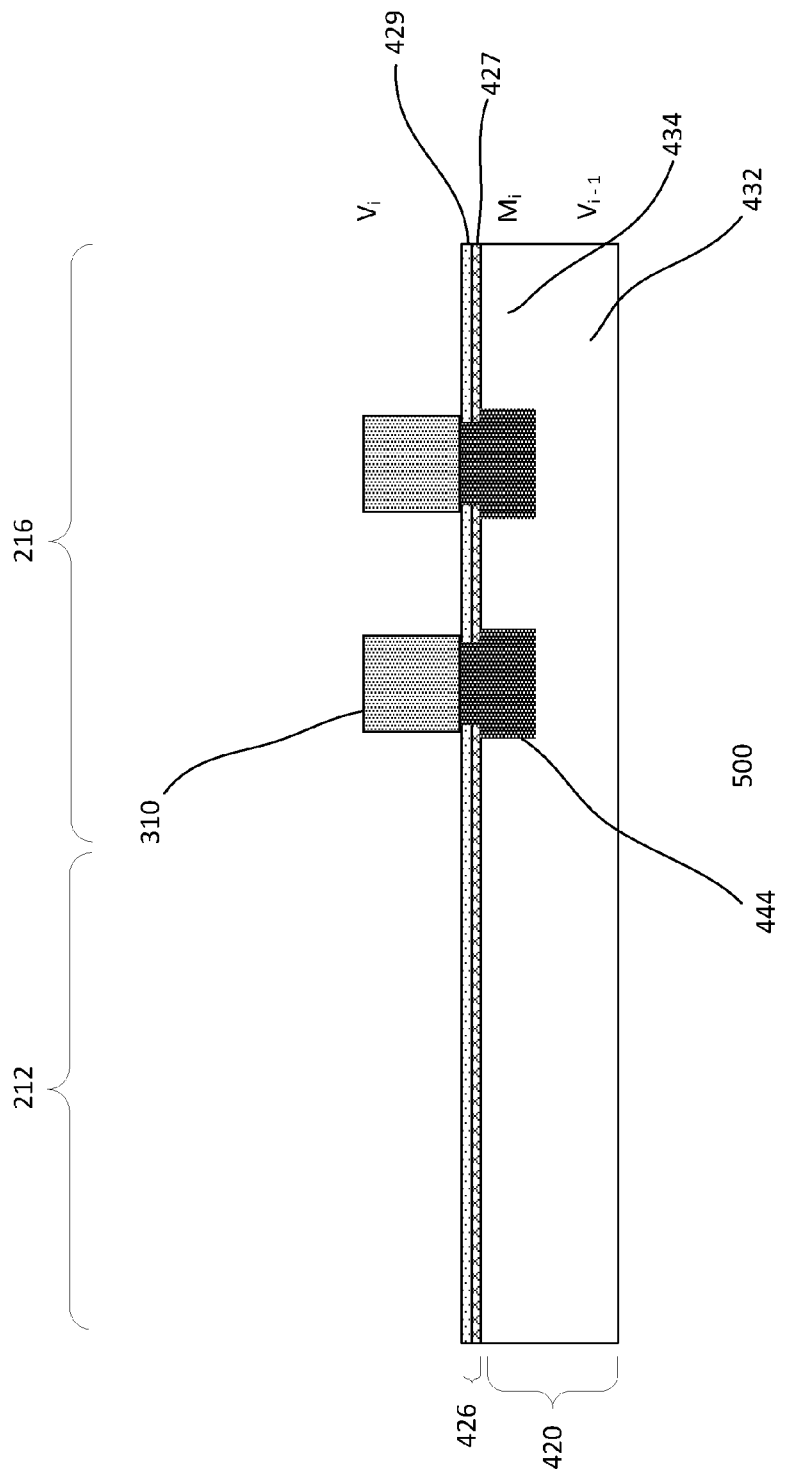

The process continues to form storage units 310, as shown in FIG. 5d. For example, storage units are formed on the dielectric layer 426 in the memory or array region 216 of the device. The storage units, for example, are magnetoresistive storage units of MRAM cells. The storage units, for example, includes storage units such as those described in FIG. 3. The storage units are not shown or described in detail. A storage unit, for example, includes a MTJ module disposed between bottom and top electrodes. Other types of storage units may also be useful. For example, the storage unit may include other types of magneto-resistive storage units as well as non-magneto resistive storage units.

The bottom electrodes of the storage units, as shown, are coupled to storage unit contacts. The storage units may be formed as describe in FIG. 3. Alternatively, other types of storage units or process for forming the storage units may also be useful. Although only two storage units are shown, it is understood that there are many more storage units. Furthermore, the space between storage units may be different. For example, some are narrower while others are wider. The different widths depend on, for example, layout of the storage units.

Figure 5E:
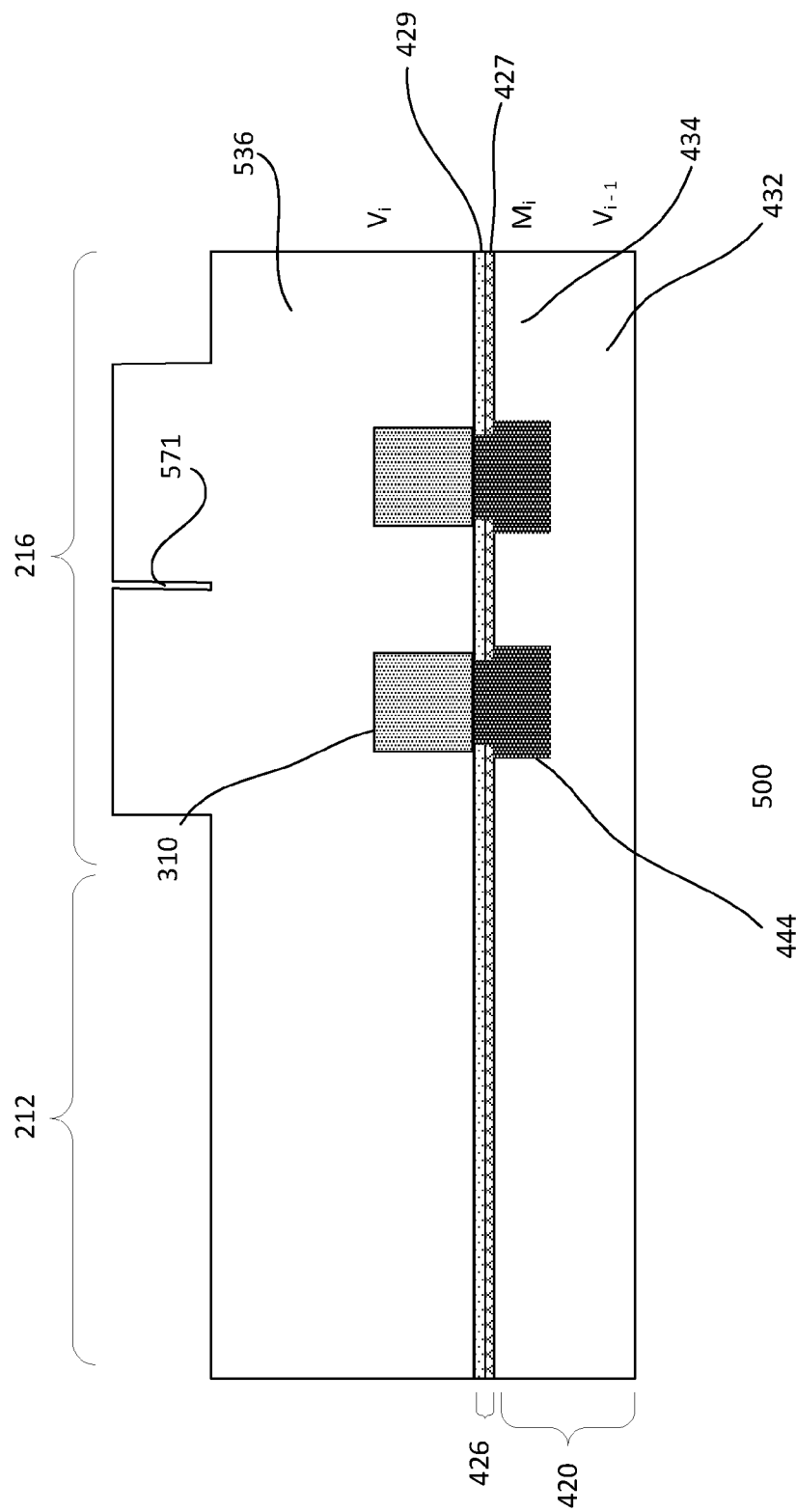

Referring to FIG. 5e, a cell dielectric layer 536 is formed on the substrate. The cell dielectric layer, in one embodiment, is a low-k dielectric layer. For example, the cell dielectric layer is a SiCOH layer. Other types of low-k dielectric may also be useful. The cell dielectric layer, in one embodiment, is the via level of the i+1 ILD level. For example, the cell dielectric layer is $V_i$ level of the i+1 ILD level. The cell dielectric layer is formed by, for example, CVD. Other techniques for forming the cell dielectric layer may also be useful.

The cell dielectric layer sufficiently covers the storage units in the memory region taking into account of subsequent processing. Due to the underlying topography created by the presence of the storage units, the as deposited cell dielectric layer includes a step. Furthermore, the storage units, as discussed, have different spacings. The cell dielectric layer sufficiently covers the gaps between the storage units. For example, the cell dielectric has a thickness of about 400-600 nm over the storage units. Providing other thicknesses over the storage units may also be useful.

In one embodiment, the cell dielectric layer may include a step 537 between the non-memory and memory regions due to the storage units. The step height, for example, may be about 100-200 nm. Other step heights may also be useful. The step height, for example, depends on the height of the storage units. The step height may be slightly higher than the than the height of the storage units. For example, in the case where a storage unit has a height of about 1500 Å, the step height may be about 1500 Å. The overall thickness of the cell dielectric layer depends on the step height. For example, a thinner cell dielectric layer may be used for a smaller step height. Conversely, a larger step height would require a thicker cell dielectric layer.

As shown in FIG. 5f, a polish rate enhancer (PRE) layer 537 is formed on the substrate. The PRE layer increases the polishing rate or CMP removal rate (RR) of the low-k cell dielectric layer. For example, PRE layer increases the polishing rate of the SiCOH layer. Furthermore, in addition to increasing the polishing rate, the PRE layer results in a more stable or controllable. Although not to be bound theory, it is believed that the PRE layer stops or reduces water absorption by the low-k dielectric layer, such as SiCOH. Water absorption changes the property of the low-k dielectric layer, such as SiCOH, causing a lower as well as different or unstable CMP RR. This results in low CMP RR and increases non-uniformity of the polished surface. By stopping or reducing water absorption by the low-k dielectric layer, a higher and more stable CMP RR results. In one embodiment, the PRE layer is a silicon oxide layer. For example, the PRE layer is a TEOS layer formed by CVD. Other types of PRE layers which stops or reduces absorption of water by the low-k SiCOH dielectric layer may also be useful. The thickness of the PRE layer may be about 300-500 Å. Other thicknesses may also be useful. As shown, the PRE layer 537 is disposed over the cell dielectric layer 536 and covers the gap 571. Since the PRE layer is a confirmed layer, it may fill or line the sidewalls of the gap, depending on its width.

Figure 5G:
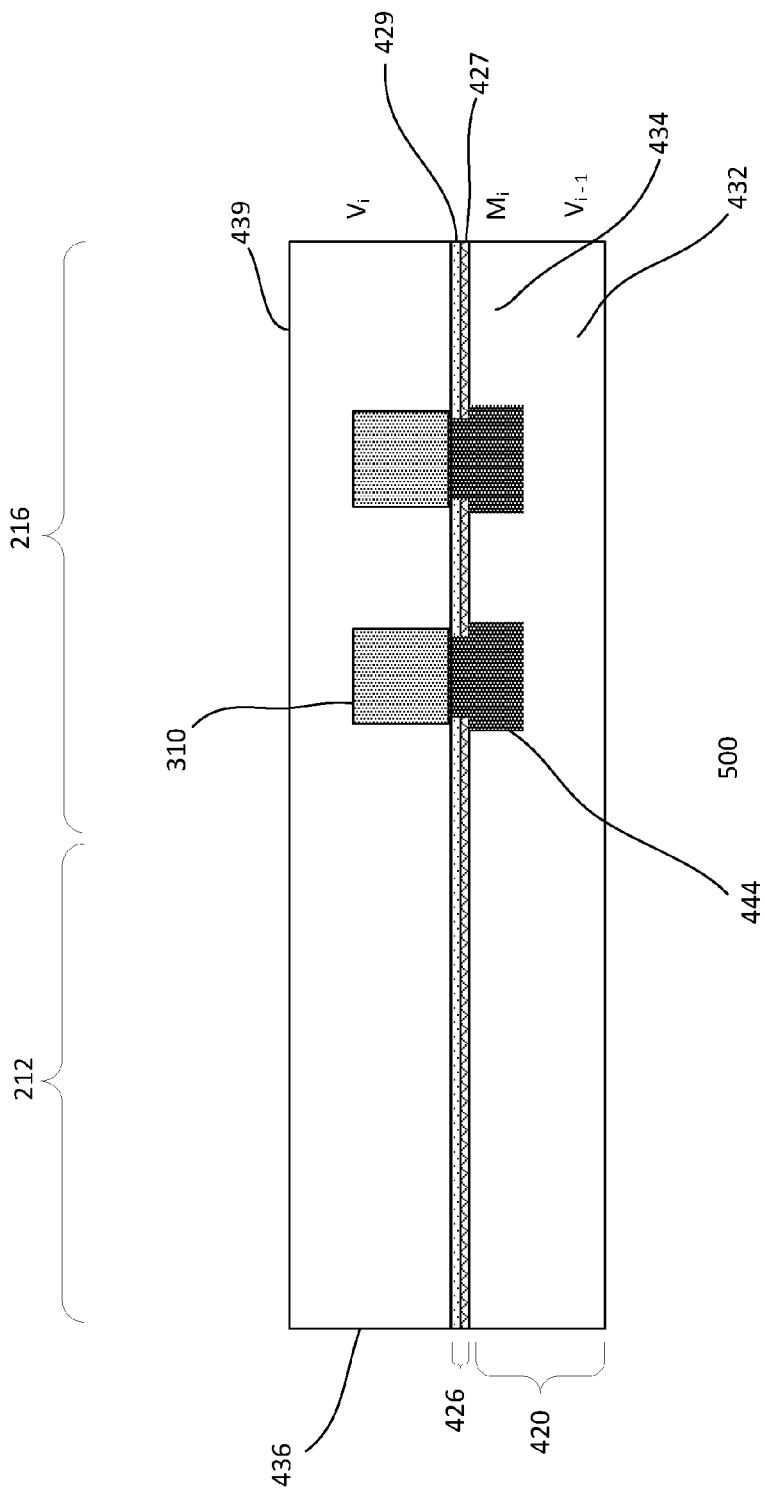

In FIG. 5g, the substrate is planarized. In one embodiment, the substrate is planarized to remove excess cell dielectric materials. Planarizing the substrate, in one embodiment, includes polishing the substrate surface. For example, chemical mechanical polishing (CMP) is employed to planarize the substrate surface. Other planarizing techniques may also be useful. As shown, the planarizing process produces a planar top surface in the cell dielectric layer in the memory and non-memory regions with increased CMP RR. The planarizing process leaves about 500 Å of cell dielectric layer above the top surface of the storage units. Providing other distances from the top of the storage units may also be useful. As discussed, a higher and more stable CMP RR results from the PRE layer. This, in effect, shortens polishing time and increases surface uniformity.

Additional processes may be performed to complete the formation of the device. For example, a metal level (not shown) may be disposed over $V_i$. For example, $M_{i-1}$ may be disposed over $V_i$. Depending on i, additional ILD levels as well as UTM level and passivation layer may be provided over $M_{i+1}$. Over device layers may also be provided. After BEOL processing is completed, the wafer may be diced to singulate the devices for packaging. In one embodiment, wire bonding may be performed on the devices and the devices are being packaged. In other embodiments, wafer level packaging may be performed. For example, wafer level packaging is performed followed by dicing the wafer to singulate the devices. Other processes may also be performed.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device comprising:
providing a substrate comprising circuit component formed on a substrate surface;
performing back-end-of-line (BEOL) processing to form a BEOL dielectric layer over the substrate, wherein the BEOL dielectric layer comprises a plurality of inter-level dielectric (ILD) levels, wherein an ILD level includes a metal level and a via level;
forming a storage unit of a memory cell between two adjacent metal levels of the BEOL dielectric layer, wherein forming the storage unit comprises,
forming a low-k cell dielectric layer over the storage unit, the low-k cell dielectric comprises a step height created by the topography of the storage unit,
forming a polishing rate enhancer (PRE) layer over the low-k cell dielectric layer, the PRE layer lining the low-k cell dielectric layer,
performing chemical mechanical polishing (CMP) on the substrate, the CMP removes the PRE and excess low-k cell dielectric layer to form a polished low-k dielectric layer with a polished top surface, and
wherein the PRE layer changes characteristics of the low-k cell dielectric layer during CMP which results in the low-k cell dielectric layer having an increased and stable CMP removal rate (RR).

2. The method of claim 1 wherein the storage unit comprises a magnetic tunnel junction of a magnetoresisitve memory cell.

3. The method of claim 1 wherein the low-k cell dielectric layer comprises a SiCOH layer.

4. The method of claim 1 wherein forming the PRE layer comprises forming a silicon oxide layer.

5. The method of claim 1 wherein the increased and stable CMP RR reduces processing time and produces a more uniform polished top surface of the polished low-k cell dielectric layer.

6. The method of claim 1 wherein the PRE layer changes characteristics of the low-k cell dielectric layer during CMP by reducing or preventing water absorption by the low-k cell dielectric layer during CMP.

7. The method of claim 1 wherein the BEOL dielectric layer comprises:

the plurality of ILD levels comprises x ILD levels, wherein each ILD layer includes
- a contact level $V_{i-1}$ where i is the $i^{th}$ ILD level of x ILD levels,
- a metal level $M_i$ where i is the $i^{th}$ ILD level of x ILD levels disposed over the contact level; and wherein the two adjacent metal levels of the BEOL dielectric layer between which the storage unit is disposed comprises
- an upper metal level $M_j$, which is a $j^{th}$ level of the x ILD levels and
- a lower metal level $M_{j-1}$.

8. The method of claim 7 comprises:

forming a cap layer over $M_{j-1}$;

forming a cell via dielectric layer over the cap layer, wherein the cap layer and cell via dielectric layer forms a lower cell via layer; and forming a lower storage unit contact plug in the lower cell via layer.

9. The method of claim 8 wherein the cap layer comprises SiCNH.

10. The method of claim 8 wherein the cell via dielectric layer comprises silicon oxide.

11. A method of forming a device comprising:

providing a substrate comprising circuit component formed on a substrate surface;

performing back-end-of-line (BEOL) processing to form a BEOL dielectric layer over the substrate, wherein the BEOL dielectric layer comprises a plurality of x inter-level dielectric (ILD) levels, wherein each ILD level comprises
- a contact level $V_{i-1}$ where i is the $i^{th}$ ILD level of x ILD levels,
- a metal level $M_i$ where i is the $i^{th}$ ILD level of x ILD levels disposed over the contact level; and forming a storage unit of a memory cell between two adjacent metal levels of the BEOL dielectric layer, wherein an upper metal level of the two adjacent metal level is $M_j$ and a lower metal level is $M_{j-1}$, and wherein forming the storage unit comprises,
- forming a low-k cell dielectric layer over the storage unit, the low-k cell dielectric comprises a step height created by the topography of the storage unit,
- forming a polishing rate enhancer (PRE) layer over the low-k cell dielectric layer, the PRE layer lining the low-k cell dielectric layer,
- performing chemical mechanical polishing (CMP) on the substrate, the CMP removes the PRE and excess low-k cell dielectric layer to form a polished low-k dielectric layer with a polished top surface, and
- wherein the PRE layer changes characteristics of the low-k cell dielectric layer during CMP which results in the low-k cell dielectric layer having an increased and stable CMP removal rate (RR).

12. The method of claim 11 wherein the low-k cell dielectric layer comprises a SiCOH layer.

13. The method of claim 11 wherein forming the PRE layer comprises forming a silicon oxide layer.

14. The method of claim 11 comprises:

forming a cap layer over $M_{j-1}$;

forming a cell via dielectric layer over the cap layer, wherein the cap layer and cell via dielectric layer forms a lower cell via layer; and forming a lower storage unit contact plug in the lower cell via layer.

15. The method of claim 11 wherein the storage unit comprises a magnetic tunnel junction (MTJ) of a magnetoresisitve random access memory (MRAM) cell.

16. The method of claim 11 wherein the increased and stable CMP RR reduces processing time and produces a more uniform polished top surface of the polished low-k cell dielectric layer.

17. The method of claim 11 wherein the PRE layer changes characteristics of the low-k cell dielectric layer during CMP by reducing or preventing water absorption by the low-k cell dielectric layer during CMP.

18. The method of claim 14 wherein the cap layer comprises SiCNH.

19. The method of claim 14 wherein the cell via dielectric layer comprises silicon oxide.

20. The method of claim 11 wherein the silicon oxide layer is formed by chemical vapor deposition (CVD).

* * * * *